United States Patent [19]
Yin

[11] Patent Number: 5,805,027
[45] Date of Patent: Sep. 8, 1998

[54] LOW CURRENT CRYSTAL OSCILLATOR WITH FAST START-UP TIME

[75] Inventor: Rong Yin, Coppell, Tex.

[73] Assignee: SGS-Thomson Microelectronics, Inc., Carrollton, Tex.

[21] Appl. No.: 642,271

[22] Filed: May 3, 1996

Related U.S. Application Data

[63] Continuation-in-part of Ser. No. 315,565, Sep. 30, 1994, abandoned.

[51] Int. Cl.$^6$ .............................. H03B 5/06; H03B 5/36
[52] U.S. Cl. .................... 331/116 FE; 331/158; 331/173
[58] Field of Search .................... 331/116 R, 116 FE, 331/158, 173

[56] References Cited

U.S. PATENT DOCUMENTS 4,871,982  10/1989  Williams et al. ................. 331/116 FE Primary Examiner—Siegfried H. Grimm
Attorney, Agent, or Firm—Theodore E. Galanthay; Lisa K. Jorgenson; Renee M. Larson

[57] ABSTRACT

Crystal oscillator circuitry provides a very fast start-up function requiring less than 100 mS. The crystal oscillator circuitry enters a stop mode when a control signal transitions from a first logic level to a second logic level thereby causing a crystal to stop oscillating. In order to initiate the fast start-up function, a pulse is provided to the gate of a transistor which is electrically connected between a first node and a second node, thus causing the voltage of the first node to move towards the voltage level of the second node and the second node to move towards the voltage level of the first node. Upon initiation of the start-up function, the energy at the crystal of the crystal oscillator circuitry is at least four times higher than the energy required in a steady state mode. The crystal oscillator circuitry has a VT (threshold voltage) independent high feedback resistance which provides stable oscillation frequency over a wide range of Vcc supply voltage. The VT independent high feedback resistance is ensured by proper sizing of the transistors of the crystal oscillator circuitry.

18 Claims, 2 Drawing Sheets

LOW CURRENT CRYSTAL OSCILLATOR WITH FAST START-UP TIME

This application is a continuation-in-part of patent application Ser. No. 08/315,565, filed Sep. 30, 1994, entitled "Low Current Crystal Oscillator with Fast Start-Up Time", assigned to SGS-Thomson Microelectronics, Inc., and now abandoned.

CROSS REFERENCE TO RELATED APPLICATIONS

The subject matter of the present application is related to copending U.S. application, Ser. No. 08/188,153, now Pat. No. 5,469,116 titled "Clock Generator Circuit with Low Current Frequency Divider", Docket No.: 93-C-31, filed Jan. 27, 1994, which is assigned to the assignee hereof and is herein incorporated by reference.

BACKGROUND OF THE INVENTION

The present invention relates generally to crystal oscillator circuitry, and more specifically to crystal oscillator circuitry with a start-up function.

Crystal oscillator circuitry is utilized in a variety of applications. Timekeeper products, for instance, are capable of keeping time during periods of time while in a standby mode through use of a battery function. Timekeeper devices use a crystal oscillator in the standby mode to supply a low battery current, Ibat, in order to sustain and prolong the battery life of the timekeeper device.

Timekeeper products, such as SGS-Thomson Microelectronics' MK48T08, as well as other products, have used a CMOS inverter as a gain stage in order to supply a low Ibat current level in the battery backup mode. Referring to FIG. 1, such a CMOS inverter circuitry 10 is shown. CMOS inverter circuitry 10 has an inverter comprised of p-channel transistor T1 and n-channel transistor T2. Resistor R1 performs a current limiting function; the lower the value of resistor R1, the higher the current gain which can be realized by CMOS inverter circuitry 10 at output signal 14. In the battery backup mode, the value of resistor R1 is increased in order to provide a low Ibat current. Resistor R2 acts as a feedback element of CMOS inverter circuitry 10. Using the circuitry 10 of FIG. 1, the start-up time which may be achieved is relatively slow and can take from 1 S to 3 S.

The problems with the solution afforded by CMOS inverter circuitry 10 of FIG. 1 are two-fold. First, resistor R1 is a large loss element which operates to degrade the performance of the entire circuit. Second, in switching between the battery back-up mode and the power-up mode, a significant bias level shift is experienced which results in unstable frequency response of the crystal oscillator over a wide range of Vcc supply voltage, typically at Vcc supply voltages greater than 1.7 volts. Thus, there exists an unmet need in the art to provide crystal oscillator circuitry with a fast start-up time and stable oscillation frequency over a wide range of Vcc supply voltage.

SUMMARY OF THE INVENTION

It would be advantageous in the art to have a crystal oscillator circuit which allows for fast start-up time.

It would further be advantageous in the art to have a crystal oscillator circuit which demonstrates stable oscillation frequency over a wide operating range.

Therefore, according to the present invention, crystal oscillator circuitry provides two important improvements over the prior art. A very fast start-up function requiring less than 100 mS is realized. The crystal of the crystal oscillator circuitry is off when the voltage level at a first node is equal to a first supply voltage and the voltage level at a second node is equal to a second supply voltage. In order to initiate the fast start-up function, a pulse is provided to the gate of a transistor which is electrically connected between the first node and the second node, thus causing the voltage of the first node to move towards the voltage level of the second node and the second node to move towards the voltage level of the first node. Upon initiation of the start-up function, the energy at the crystal of the crystal oscillator circuitry is at least four times higher than the energy required in a steady state mode. Additionally, the crystal oscillator circuitry has a VT (threshold voltage) independent high feedback resistance which provides stable oscillation frequency over a wide range of Vcc supply voltage. The VT independent high feedback resistance is ensured by proper sizing of the transistors of the crystal oscillator circuitry.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DESCRIPTION OF THE INVENTION

Figure 2:
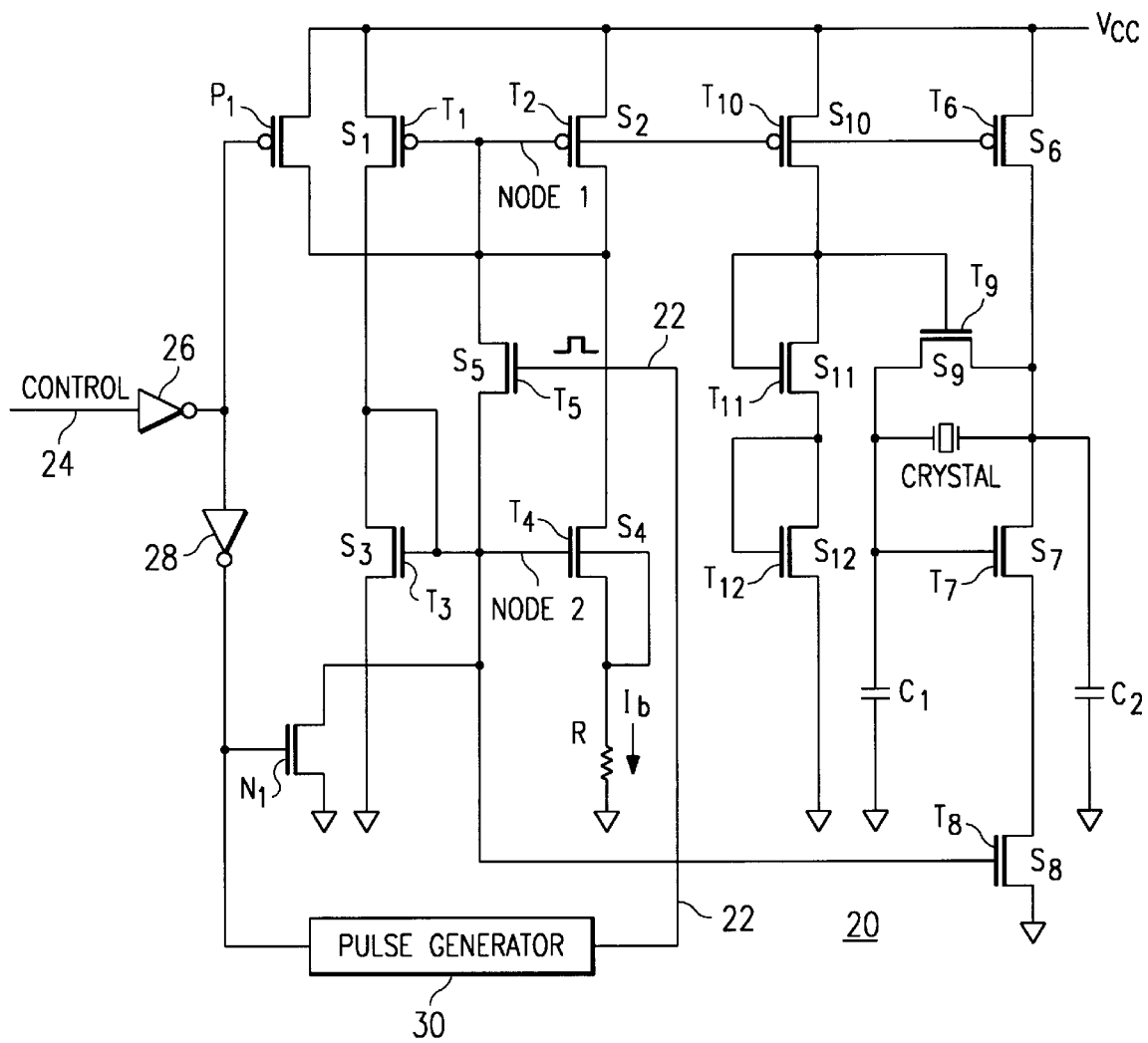
FIG. 2 is a schematic diagram of crystal oscillator circuitry with start-up function, according to the present invention.

Referring to FIG. 2, a crystal oscillator circuit 20 with start-up function, according to the present invention is shown. Circuit 20 is comprised of a plurality of transistors P1, N1, T1, T2, T3, T4, T5, T6, T7, T8, T9, T10, T11 and T12, a resistor R, a crystal Crystal, inverters 26 and 28, Pulse Generator 30, and capacitors C1 and C2. The sizes of transistors T1 to T12, defined as the width divided by the length of a transistor, are denoted by S1, S2, S3, S4, S5, S6, S7, S8, S9, S10, S11, and S12. For instance, the size of transistor T1 is denoted by S1, which is defined as the width divided by the length of transistor T1.

The electrical connections of circuit 20 will now be described. Vcc supply voltage is provided to a first source/drain of transistor P1, a first source/drain of transistor T1, a first source/drain of transistor T2, a first source/drain of transistor T10, and a first source/drain of transistor T6. Vss supply voltage is provided to a first source/drain of transistor N1, a first source/drain of transistor T3, a first terminal of resistor R, a first source/drain of transistor T12, a first terminal of capacitor C1, a first terminal of capacitor C2, and a first source/drain of transistor T8, as shown. Node 1 is defined as the electrical connection of a second source/drain of transistor P1, the gate of transistor T1, the gate of transistor T2, a second source/drain of transistor T2, a second source/drain of transistor T4, the gate of transistor T10, the gate of transistor T6, and a first source/drain of transistor T5. Node 2 is defined as the electrical connection of a second source/drain of transistor T1, a second source/drain of transistor T3, the gate of transistor T3, a second source/drain of transistor N1, a second source/drain of transistor T5, the gate of transistor T8, and the gate of transistor T4. The substrate of transistor T4 is connected to the first source/drain of transistor T4 and to a second terminal of resistor R as shown. The second source/drain of transistor T10 is electrically connected to the gate of transistor T9, a first source/drain of transistor T11, and the gate of transistor T11. The second source/drain of transistor T11 is electrically connected to a second source/drain of transistor T12 as well as the gate of transistor T12. A second source/drain of transistor T6 is electrically connected to a first source/drain of transistor T9, a first terminal of Crystal, a first source/drain of transistor T7, and a second terminal of capacitor C2. The second source/drain of transistor T9 is electrically connected to the second terminal of Crystal, the gate of transistor T7, and the second terminal of capacitor C1. The second source/drain of transistor T7 is electrically connected to the second source/drain of transistor T8. The gates of transistors P1 and N1 are controlled by the state of Control signal 24. Control signal 24 is first inverted by inverter 26. The output signal of inverter 26 controls the gate of transistor P1 and is presented to inverter 28 as an input signal. The output signal of inverter 28 controls the gate of transistor N1 and is provided as an input signal to Pulse Generator 30 which produces a pulse 22 that controls the gate of transistor T5.

Transistors T1, T2, T3 and T4 form current reference circuitry. P-channel transistors T1 and T2 form a first current mirror having a gain of S1/S2. It should be noted that the connection of the second source/drain of transistor T2 to the first source/drain of transistor T5, the second source/drain of transistor P1, and the gates of transistors T1 and T2 is necessary for transistors T1 and T2 to form the first current mirror. N-channel transistors T3 and T4 form a second current mirror having a gain of S4/S3, if the current through the second current mirror is small enough so that the resistance of resistor R is negligible. As can be seen from FIG. 2, the first and second current mirrors are connected in a closed loop, with the gain of the closed loop being the product of the gain of the first current mirror and the gain of the second current mirror. The closed loop gain for small current is chosen higher than unity (one), such that upon start-up of the Crystal the current through transistors T1 and T3 and through transistors T2 and T4 increases from zero until an equilibrium is reached. When this equilibrium point is reached, the closed loop gain is reduced to unity (one) by operation of the voltage drop Vr across resistor R.

P-channel transistors T2 and T10, T2 and T6 form two additional current mirrors having a gain of S10/S2 and S6/S2, respectively. N-channel transistor T9 provides a feedback resistance whose value is dependent on both the size S9 of transistor T9 and the gate voltage of transistor T9 which is determined by the operation of transistors T10, T11, and T12. Furthermore, the Crystal, load capacitors C1 and C2, the feedback resistance of transistor T9, and a gain stage formed by transistors T6, T7, and T8 form a crystal oscillator.

In order to achieve a low current crystal oscillator, the transistors of FIG. 2 operate in the weak inversion or subthreshold region so that the transistors have very small current. The operating current through transistors T1 and T3, for instance, may be as low as 10 nA. Without initialization, then, it would take an unacceptably long period of time to start the crystal oscillator. For this reason, the start-up circuitry afforded by transistors P1, N1, inverters 26, 28, and Pulse Generator 30 facilitate the use of weak inversion transistors to achieve a low current crystal oscillator.

In addition to facilitating low current operation, the Crystal of circuit 20 may be turned off in order to minimize current drain. This is especially advantageous when circuit 20 is contained within products relegated to spend significant periods of time "on the shelf" before use. The use of circuit 20 in battery backed-up devices, such as Timekeeper and Zeropower products, for example, minimizes current drain on the battery by simply turning off the crystal oscillator.

The operation of circuit 20 is controlled by the start-up circuitry afforded by transistors P1, N1, inverters 26 and 28, and Pulse Generator 30. Changing the logic state of Control signal 24 allows the Crystal of circuit 20 to be started or stopped upon demand. To illustrate, assume that start-up of Crystal has been accomplished and that the Crystal is on. Control signal 24 is equal to a low logic level (ground), transistors T1–T4 and T6–T12 are conducting in steady state operation, and transistors P1, N1, and T5 are not conducting after start-up is achieved. It is now desired to stop the Crystal. Control signal 24 is forced from the low logic level (ground) to the high logic level (Vcc), thereby causing transistors P1 and N1 to conduct. Node 1 is pulled to Vcc while Node 2 is simultaneously pulled to ground. In this stop mode, only transistors P1 and N1 conduct; transistors T1–T12 do not conduct.

Figure 4:
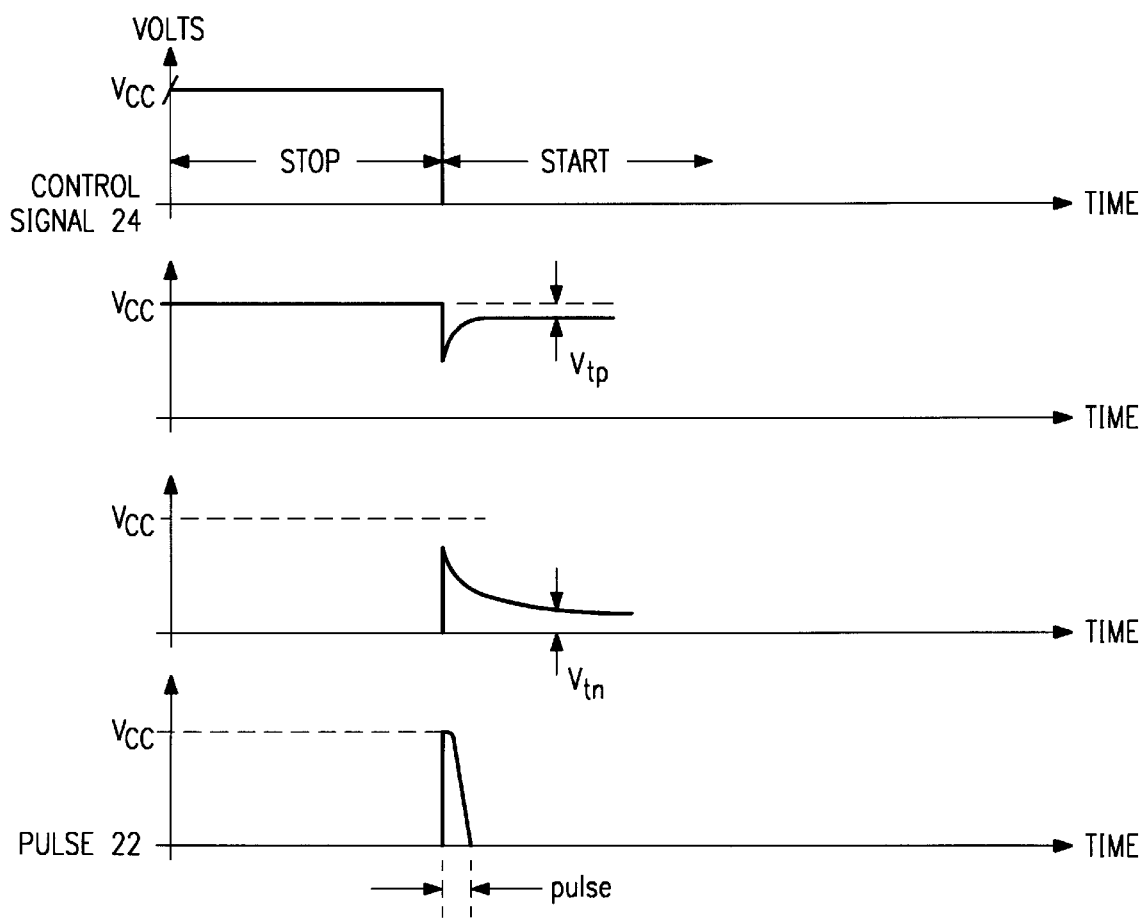
FIG. 4 is a voltage waveform of select nodes of the crystal oscillator circuit, according to the present invention.

When it is desired to start the Crystal, the start-up mode is initiated. Control signal 24 is forced from Vcc to ground. This change in the state of Control signal 24 causes transistors P1 and N1 to not conduct. The low going Control signal 24 also causes Pulse Generator 30 to generate the pulse 22 which is received by the gate of transistor T5, thereby causing Node 1 to initially spike towards ground potential before settling to a voltage approximated by Vcc–Vtp (p-channel transistor voltage) and simultaneously causing Node 2 to initially spike towards Vcc voltage potential before settling to a voltage approximated by VTN (n-channel transistor voltage) above ground potential. The waveforms of Node 1 and Node 2 are shown in FIG. 4. Pulse 22 is a narrow pulse that introduces a high initial current to circuit 20, as shown in FIG. 4. This high initial current is mirrored to the gain stage comprised of transistors T6, T7 and T8 thereby causing the Crystal to start oscillating. Eventually transistors T1–T4 and T6–T12 reach an equilibrium or steady state. Transistor T5 does not conduct after it has received the initial pulse 22 generated by Pulse Generator 30. In the start-up mode, transistors P1, N1 and T5 do not conduct; but transistors T1–T4 and T6–T12 do conduct.

Figure 3:
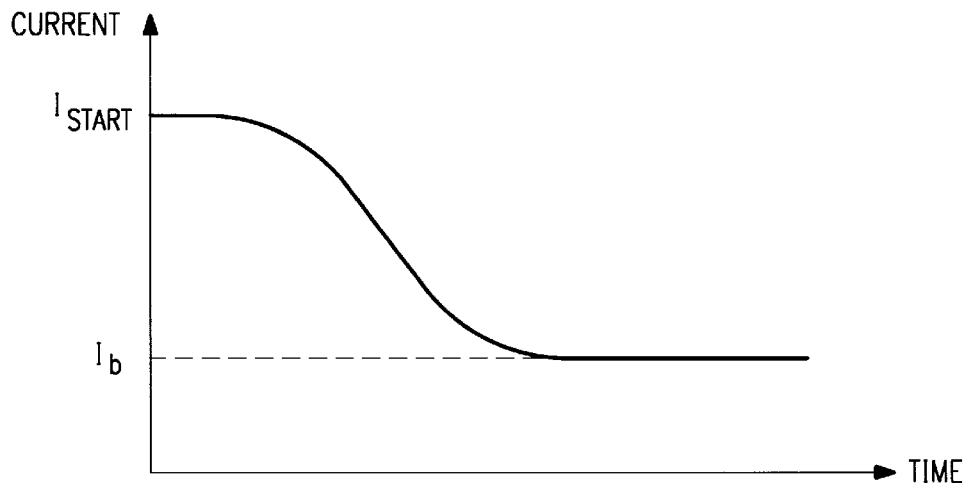
FIG. 3 is a graph showing the current level of the initial start boost function versus regular operating current, according to the present invention.

Circuit 20 provides two functions. First, circuit 20 provides a start-up function and, second, circuit 20 provides a VT independent high feedback resistance that was not to be found in the prior art crystal oscillator circuitry shown in FIG. 1. As previously mentioned, the oscillator function of circuit 20 is off and in a stop state when the voltage at Node 1 is equal to Vcc and the voltage at Node 2 is equal to Vss. In order to utilize the fast start-up function of circuit 20, a pulse 22, such as a square pulse which might be generated by any number of digital circuits such as Pulse Generator 30, is presented to the gate of transistor T5. This causes transistor T5 to pull Node 1 down and Node 2 up. A very high initial current is generated and mirrored to the gain stage which is comprised of transistors T6, T7, and T8. Transistors T10, T11, and T12 control the level of voltage which is supplied to the gate of transistor T9. After this start-up boost function is initiated, the initial energy at Crystal is at least four times higher than the energy required by circuit 20 in a steady state mode, and bias current Ib returns to the operating current as determined by current source resistor R. This is shown in FIG. 3 where the current level of the initial start-up boost function is denoted by Istart and the operating current is denoted by Ib. Results show that the start-up time using the present invention is less than approximately 100 mS, as opposed to the 1 S to 3 S start-up time of the prior art.

In order to obtain a high performance oscillator function, the feedback resistance of circuit 20 is also very important. The feedback resistance is defined as the resistance of transistor T9 and is denoted as R9. Employing general transistor equations, R9 is defined as follows:

$$R9 \cong 1/[2*k*(V_{GS9}-V_{T9})*(W/L)_9] \qquad 1.$$

where k is equal to $M*C_{ox}/2$ (where M represents the mobility and Cox represents the gate capacitance of a transistor; these parameters are standard to the process), $V_{GS9}$ is equal to the gate to source voltage of transistor T9, $V_{T9}$ is equal to the transistor voltage of transistor T9, and $(W/L)_9$ is equal to the size of Transistor 9, i.e. the width divided by the length of transistor T9.

In order to ensure a VT independent feedback resistance with high resistor value of R9, a design ratio represented by the following design equation is used:

$$S7/S12 = S6/S10, \qquad 2.$$

where the $V_{DS8}$ effect, the drain to source voltage of transistor T8, is negligible such that both transistors T9 and T11 have the same $V_T$ or transistor voltage. In equation 2, S7 denotes the size of transistor T7, S12 denotes the size of transistor T12, S6 denotes the size of transistor T6, and S10 denotes the size of transistor T10.

Since transistors T9 and T11 operate in a strong inversion region of circuitry 20, the current through transistor T11, I11, is defined as:

$$I11 = S11*k*(V_{GS11}-V_{T11})^2, \text{and} \qquad 3.$$

$$V_{GS11}-V_{T11} \cong V_{GS9}-V_{T9} = \sqrt{I11}/\sqrt{(S11*k)}, \qquad 4.$$

where I11 denotes the current through transistor T11, S11 denotes the size of transistor T11, $V_{GS11}$ denotes the gate to source voltage of transistor T11, and $V_{T11}$ denotes the transistor voltage of transistor T11.

Substituting Vhd $GS11-V_{T11}=\sqrt{I11}/\sqrt{(S11*k)}$ into equation 1 above yields the following equation:

$$R9 \cong [\sqrt{S11}*(\sqrt{I11})^{-1}]/[2*S9*\sqrt{k}] \qquad 5.$$

For a given bias current, Ib, through resistor R as shown in FIG. 2, I11=S10/S2*Ib, and thus:

$$R9 = (\sqrt{(S11/k)}/2*S9)*(\sqrt{S2/S10})*(\sqrt{Ib})^{-1} \qquad 6.$$

Rewriting equation 6 yields:

$$R9 = 1/(2*S9)*\sqrt{((S11*S2)/(S10*k*Ib))} \qquad 7.$$

Examination of equation 7 shows that a large size S11 of transistor T11 will yield a high resistance value R9 of transistor T9. However, S11 must not become too large to upset the small current requirement of I11 necessary to make sure that transistor T11 works in strong inversion to transistor T9. Thus, there is a tradeoff between the feedback resistance value represented by R9 and the amount of current consumed by circuit 20. Using the above equations and circuit 20 of FIG. 2, the resistor value of R9 can be as high as 200 MOhms over the operating range of the circuit.

Figure 1:
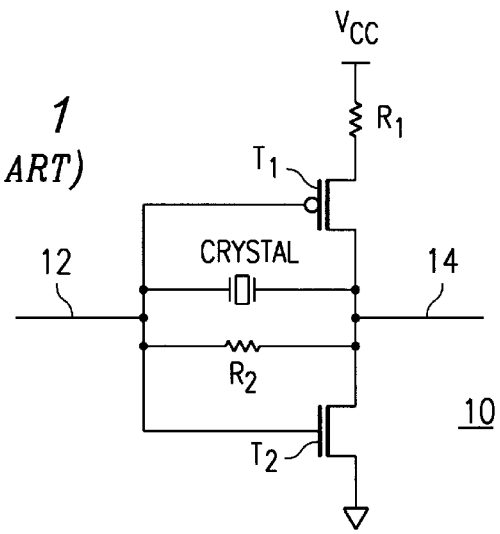
FIG. 1 is a schematic diagram of a CMOS inverter as a gain stage, according to the prior art.

The present invention, embodied in crystal oscillator circuitry 20 with start-up function of FIG. 2, addresses the problems with the prior art solution of FIG. 1. A very fast start-up function taking less than 100 mS is possible with the present invention. This is a significant improvement over the slower start-up time of 1 S to 3 S experienced with prior art solutions. Additionally, the present invention ensures a high performance oscillator function by providing a VT independent high feedback resistance of circuitry 20.

While the invention has been particularly shown and described with reference to a preferred embodiment, it will be understood by those skilled in the art that various changes in form and detail may be made therein without departing from the spirit and scope of the invention.

What is claimed is:

1. A crystal oscillator circuit having a fast start-up time and stable oscillation frequency over a wide operating range of supply voltage, comprising:

a first supply voltage;

a second supply voltage;

a control signal;

means for generating a pulse signal which is controlled by the control signal;

a crystal;

a first capacitive element having a first terminal connected to the second supply voltage;

a second capacitive element having a first terminal connected to the second supply voltage;

a p-channel transistor having a first source/drain connected to the first supply voltage and a gate controlled by the control signal;

an n-channel transistor having a first source/drain connected to the second supply voltage and a gate controlled by the control signal;

a first transistor having a first source/drain connected to the first supply voltage;

a second transistor having a first source/drain connected to the first supply voltage and a gate connected to a gate of the first transistor;

a third transistor having a first source/drain connected to the second supply voltage;

a fourth transistor having a first source/drain connected to a second source/drain of the second transistor and having a gate connected to a gate of the third transistor, a second source/drain of the third transistor and a second source/drain of the n-channel transistor;

a resistive element having a first terminal connected to the second supply voltage and a second terminal connected to the second source/drain of the fourth transistor;

a fifth transistor having a first source/drain connected to a second source/drain of the p-channel transistor, the gate of the first transistor, the gate of the second transistor, the second source/drain of the second transistor, the first source/drain of the fourth transistor to form a first node, a second source/drain connected to the gate of the fourth transistor, and a gate controlled by the pulse signal;

a sixth transistor having a first source/drain connected to the first supply voltage;

a seventh transistor having a first source/drain connected to a second source/drain of the sixth transistor, a first terminal of the crystal and a second terminal of the second capacitive element, and a gate connected to a second terminal of the first capacitive element and a second terminal of the crystal;

an eighth transistor having a first source/drain connected to the second supply voltage, a second source/drain connected to a second source/drain of the seventh transistor, and a gate connected to the second source/drain of the fifth transistor, the second source/drain of the third transistor, the gate of the third transistor, the second source/drain of the n-channel transistor, and the gate of the fourth transistor to form a second node;

a ninth transistor having a first source/drain connected to the second source/drain of the sixth transistor, and a second source/drain connected to the second terminal of the crystal;

a tenth transistor having a first source/drain connected to the first supply voltage, a gate connected to the gate of the second transistor, the gate of the first transistor and a gate of the sixth transistor;

an eleventh transistor having a gate and a first source/drain connected to a second source/drain of the tenth transistor and a gate of the ninth transistor; and a twelfth transistor having a first source/drain connected to the second supply voltage, and a gate and a second source/drain connected to a second source/drain of the eleventh transistor.

2. The circuit of claim 1, wherein the means for generating a pulse signal is a pulse generator.

3. The circuit of claim 1, wherein the pulse signal is a square pulse signal.

4. The circuit of claim 1, wherein the first supply voltage is Vcc and the second supply voltage is ground.

5. The circuit of claim 1, wherein the pulse signal which controls the gate of the fifth transistor causes a large current to be generated that is mirrored to a gain stage.

6. The circuit of claim 5, wherein the gain stage is comprised of the sixth transistor, the seventh transistor, and the eighth transistor.

7. The circuit of claim 1, wherein a start-up mode starts the crystal in less than approximately 100 mS.

8. The circuit of claim 1, wherein the crystal oscillator circuit ensures a threshold voltage independent feedback resistance with a high resistor value of R9, the resistance of the ninth transistor as defined by the following equation:

$$S7/S12 = S6/S10,$$

wherein S6 represents the size of the sixth transistor, S7 represents the size of the seventh transistor, S10 represents the size of a tenth transistor, and S12 represents the size of a twelfth transistor.

9. The circuit of claim 1, wherein the ninth transistor provides a feedback resistance that provides stable oscillation frequency over a wide range of the first supply voltage.

10. A crystal oscillator circuit having a fast start-up time and stable oscillation frequency over a wide operating range of supply voltage, comprising:

a first supply voltage;

a second supply voltage;

a control signal;

means for generating a pulse signal which is controlled by the control signal;

a crystal;

a first capacitive element having a first terminal connected to the second supply voltage;

a second capacitive element having a first terminal connected to the second supply voltage;

a p-channel transistor having a first source/drain connected to the first supply voltage and a gate controlled by the control signal;

an n-channel transistor having a first source/drain connected to the second supply voltage and a gate controlled by the control signal;

a first transistor having a first source/drain connected to the first supply voltage;

a second transistor having a first source/drain connected to the first supply voltage and a gate connected to a gate of the first transistor;

a third transistor having a first source/drain connected to the second supply voltage;

a fourth transistor having a first source/drain connected to a second source/drain of the second transistor and having a gate connected to a gate of the third transistor, a second source/drain of the third transistor and a second source/drain of the n-channel transistor;

a resistive element having a first terminal connected to the second supply voltage and a second terminal connected to the second source/drain of the fourth transistor;

a fifth transistor having a first source/drain connected to a second source/drain of the p-channel transistor, the gate of the first transistor, the gate of the second transistor, the second source/drain of the second transistor, the first source/drain of the fourth transistor to form a first node, having a second source/drain connected to the gate of the fourth transistor, and a gate controlled by the pulse signal;

a sixth transistor having a first source/drain connected to the first supply voltage;

a seventh transistor having a first source/drain connected to a second source/drain of the sixth transistor, a first terminal of the crystal and a second terminal of the second capacitive element, and a gate connected to a second terminal of the first capacitive element and a second terminal of the crystal;

an eighth transistor having a first source/drain connected to the second supply voltage, a second source/drain connected to a second source/drain of the seventh transistor, and a gate connected to the second source/drain of the fifth transistor, the second source/drain of the third transistor, the gate of the third transistor, the second source/drain of the n-channel transistor, and the gate of the fourth transistor to form a second node;

a ninth transistor having a first source/drain connected to the second source/drain of the sixth transistor, and a second source/drain connected to the second terminal of the crystal;

a tenth transistor having a first source/drain connected to the first supply voltage, a gate connected to the gate of the second transistor, the gate of the first transistor and a gate of the sixth transistor;

an eleventh transistor having a gate and a first source/drain connected to a second source/drain of the tenth transistor and a gate of the ninth transistor; and a twelfth transistor having a first source/drain connected to the second supply voltage, and a gate and a second source/drain connected to a second source/drain of the eleventh transistor;

wherein a transition of the control signal from a first logic state to a second logic state defines a stop mode in which the p-channel transistor conducts, the n-channel transistor conducts, the first node is pulled to the first supply voltage, the second node is pulled to the second supply voltage, and the first, second, third, fourth, fifth, sixth, seventh, eighth, ninth, tenth, eleventh, and twelfth transistors do not conduct; and wherein a transition of the control signal from the second logic state to the first logic state defines a start-up mode in which the p-channel transistor and the n-channel transistor do not conduct; the means for generating a pulse signal controls the gate of the fifth transistor, thereby causing a voltage of the first node to initially spike towards the second supply voltage before settling to a voltage equal to the first supply voltage less a transistor voltage of the p-channel transistor, a voltage of the second node to initially spike towards the first supply voltage before settling to a voltage equal to the second supply voltage plus a transistor voltage of the n-channel transistor; the first transistor, the second transistor, the third transistor, the fourth transistor, the sixth transistor, the seventh transistor, the eighth transistor, the ninth transistor, the tenth transistor, the eleventh transistor, and the twelfth transistor conduct; the p-channel transistor, the n-channel transistor, and the fifth transistor do not conduct; and the crystal starts oscillation.

11. The circuit of claim 10, wherein the means for generating a pulse signal is a pulse generator.

12. The circuit of claim 11, wherein the pulse signal is a square pulse signal.

13. The circuit of claim 10, wherein the first supply voltage is Vcc and the second supply voltage is ground.

14. The circuit of claim 10, wherein the pulse signal which controls the gate of the fifth transistor causes a large current to be generated that is mirrored to a gain stage.

15. The circuit of claim 14, wherein the gain stage is comprised of the sixth transistor, the seventh transistor, and the eighth transistor.

16. The circuit of claim 10, wherein the start-up mode starts the crystal in less than approximately 100 mS.

17. The circuit of claim 10, wherein the crystal oscillator circuit ensures a threshold voltage independent feedback resistance with a high resistor value of R9, the resistance of the ninth transistor as defined by the following equation:

$$S7/S12 = S6/S10,$$

wherein S6 represents the size of the sixth transistor, S7 represents the size of the seventh transistor, S10 represents the size of a tenth transistor, and S12 represents the size of a twelfth transistor.

18. A method for obtaining fast start-up time and stable oscillation frequency over a wide operating range of a crystal oscillator circuit, comprising the steps of:

sizing a plurality of transistors of the crystal oscillator circuit such that the crystal oscillator circuit provides stable oscillation frequency over a wide range of a first supply voltage;

forcing a control signal from a first logic state to a second logic state to define a stop mode in which a crystal of the crystal oscillator circuit stops;

forcing the control signal from the second logic state to the first logic state to define a start-up mode in which a pulse input signal is generated; and applying the pulse input signal to a gate of a first transistor of the crystal oscillator circuit in order to initiate a fast start-up of the crystal oscillator circuit.

* * * * *